(12) United States Patent
Agrawal et al.

(10) Patent No.: US 8,891,153 B2
(45) Date of Patent: Nov. 18, 2014

(54) METHOD OF MANUFACTURING ELECTROOPTIC DEVICES

(75) Inventors: Anoop Agrawal, Tucson, AZ (US); Juan Carlos Lopez Tonazzi, Tucson, AZ (US)

(73) Assignee: Ajjer, LLC, Tucson, AZ (US)

( * ) Notice: Subject to any disclaimer, the term of this patent is extended or adjusted under 35 U.S.C. 154(b) by 294 days.

(21) Appl. No.: 12/816,094

(22) Filed: Jun. 15, 2010

(65) Prior Publication Data

US 2010/0315717 A1 Dec. 16, 2010

Related U.S. Application Data

(60) Provisional application No. 61/187,619, filed on Jun. 16, 2009.

(51) Int. Cl.
| | | |
|---|---|---|
| *G02B 5/08* | (2006.01) | |
| *G02F 1/15* | (2006.01) | |
| *G02F 1/161* | (2006.01) | |
| *B60R 1/08* | (2006.01) | |
| *H01L 51/52* | (2006.01) | |
| *H01L 51/56* | (2006.01) | |

(52) U.S. Cl.
CPC ............... *B60R 1/088* (2013.01); *G02F 1/161* (2013.01); *H01L 51/5237* (2013.01); *H01L 51/56* (2013.01)
USPC ............ 359/273; 359/842; 359/844; 359/884

(58) Field of Classification Search
USPC .................. 359/267, 273, 604, 841–844, 884
See application file for complete search history.

(56) References Cited

U.S. PATENT DOCUMENTS

| | | | | |
|---|---|---|---|---|
| 5,193,690 A | * | 3/1993 | Powers et al. | 209/558 |
| 5,675,495 A | * | 10/1997 | Biermann et al. | 700/97 |
| 5,724,187 A | * | 3/1998 | Varaprasad et al. | 359/608 |
| 6,193,678 B1 | * | 2/2001 | Brannon | 601/15 |
| 6,239,898 B1 | * | 5/2001 | Byker et al. | 359/265 |
| 6,321,570 B1 | * | 11/2001 | De Vries et al. | 65/104 |
| 6,493,128 B1 | * | 12/2002 | Agrawal et al. | 359/265 |
| 6,816,297 B1 | * | 11/2004 | Tonar et al. | 359/265 |
| 7,525,714 B2 | * | 4/2009 | Poll et al. | 359/265 |
| 8,021,005 B2 | * | 9/2011 | Zhao | 359/868 |
| 2006/0232853 A1 | * | 10/2006 | Dobschal et al. | 359/366 |
| 2007/0247863 A1 | * | 10/2007 | Liou | 362/517 |
| 2008/0079880 A1 | * | 4/2008 | Mochizuki et al. | 349/122 |
| 2008/0105368 A1 | * | 5/2008 | Watanabe | 156/250 |
| 2011/0128479 A1 | * | 6/2011 | Saitoh | 349/96 |
| 2012/0125400 A1 | * | 5/2012 | Angel et al. | 136/246 |

OTHER PUBLICATIONS

Kazuaki Kondo et al., "Free-Form Mirror Design Inspired by Photometric Stereo", "Dans The 8$^{th}$ Workshop on Omnidirectional Vision, Camera Networks and Non-classical Cameras—OMNIVIS (2008)", Sep. 28, 2008, pp. 1-12.*

R. A. Ramsey et al., "Electrochromic blueshift in polymer-dispersed liquid-crystal cells", Optics Letters, vol. 29, No. 19, Oct. 1, 2004, pp. 2237-2239.*

* cited by examiner

*Primary Examiner* — Frank Font

(57) ABSTRACT

This invention discloses a low cost method to manufacture electrooptic devices at low cost and discloses materials that may be used in fabrication of electrooptic devices.

9 Claims, 5 Drawing Sheets

METHOD OF MANUFACTURING ELECTROOPTIC DEVICES

RELATED APPLICATION/CLAIM OF PRIORITY

This application is related to and claims priority from Provisional application Ser. No. 61/187,619 filed Jun. 16, 2009, which provisional application is incorporated by reference herein.

BACKGROUND OF THE INVENTION

Many electrooptical products are made in large numbers which require many different operations. Electrooptic (EO) devices are those where an application of electronic stimulus leads to a change in optical property. The optical property can be optical density, color change, optical reflectivity change, or change in optical emission. For example in one product, one may require forming the shape of the product, coating and then followed by assembly. Some examples of such electrooptic products are lens and filter assemblies, automotive and motorcycle rear-view mirrors, displays and windows, solid state lights, etc. Some of the products are made efficiently and are available at attractive costs while others are done less efficiently. This innovation discloses methods of making EO devices in an efficient method. In addition many electrooptical devices require metallic layers that work both as conductors and optical reflectors. This innovation also discloses novel reflectors that have higher corrosion resistance to be used in EO devices that reduce manufacturing costs.

Digital video disks (DVDs) are produced inexpensively, although these require precision molding of two substrates, deposition of several layers of materials by physical vapor deposition, dispensing of glue, and assembly including 100% inspection. These are produced in line where the substrate formation is integrated with coating and assembly process in one equipment, with no manual manipulation of parts. Each of the processing steps is matched to the rates of the next step to avoid any accumulation and the molded substrates directly transition to the coating processes. As an example commercial rear-view mirrors are used in automotive and other transportation industry which are made in 10's of millions every year use two substrates with an electrochromic electrolyte sandwiched between them. However, the manufacturing processes are costly that end up in such mirrors being expensive. This invention lays out details of materials and processes for making inexpensive electrochromic (EC) devices for any application, and also other electrooptic devices that use two substrates with an electrooptic medium in between (e.g., liquid crystal devices) or require a number of coatings (e.g. organic light emitting diodes). For example, inexpensive manufacturing of EC rear-view mirrors will allow more consumers to benefit from the safety aspects of the EC technology. The inefficiency in making rearview mirrors comes in by mixing materials and processes in a way that they are separated by large batch processes. This results in large inventory between processes, and also addition of processing steps are used which would not be needed if there was no manual interruption/accumulation through the entire process. As an example, bent EC mirrors are made by slumping a stack of two sheets of glass so that their curvatures are matched. Thus one has to stack a large inventory of such glass sheets. Several mirror shapes are cut and each pair is marked so that when the final assembly is done this pair is assembled in the same orientation in which it was cut. This ensures uniform spacing between the two sheets which is later occupied by the electrolyte However, in the bending/cutting processes, cut chips and surface stains are formed, which need to be washed before coating. The washers are large, and again they require inventory buildup before and after. In addition the washing step consumes large amount of resources in terms of clean water and utilities for drying, and generation of waste water. Thus environmentally friendly methods that minimize the use of resources in manufacturing and do not generate waste are preferred. In this innovation it will be demonstrated that these issues can be overcome to make products using low cost manufacturing techniques, low labor costs and with smaller environmental footprint. Such methods are commonly used in DVD manufacturing but not used in electrooptic devices. For example, complete DVD production lines that integrate substrate molding, coating and assembly are available from Singulus Technologies AG (Germany). These methods may be used to form other EO products, e.g. those that emit light. For example, organic light emitting diodes can be made by forming the substrate and coating operations in one machine.

BRIEF SUMMARY OF THE INVENTION

This invention describes novel processes and materials to reduce cost of electrooptical device assemblies in large volume.

One objective of this invention is to illustrate a low cost method to make electrochromic rear-view mirrors.

Yet another objective is to make similar integrated optical components at low manufacturing cost.

The invention also discloses corrosion resistant compositions for reflective and conductive layers that may be used for automotive electrochromic mirrors.

DETAILED DESCRIPTION OF THE INVENTION

Low Cost Method to Make EC Mirrors

Figure 1:
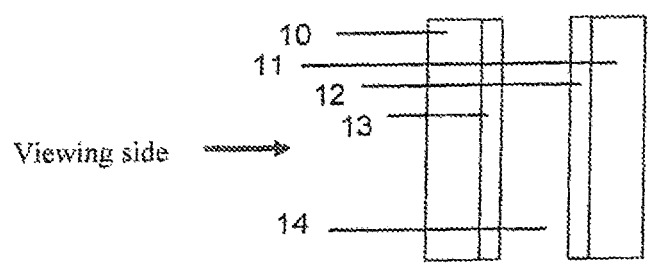
FIG. 1: Schematics of a third surface EC mirror.
Figure 2:
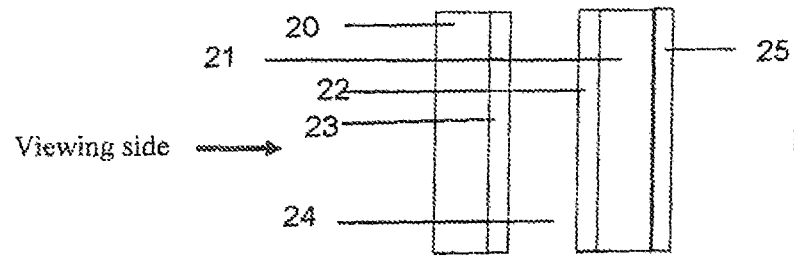
FIG. 2: Schematics of a fourth surface EC mirror.

This invention teaches a method to produce a large volume of electrooptical components and assemblies at reduced cost. This will be primarily illustrated on electrochromic rear-view mirrors. FIGS. 1 and 2 show schematics of 3rd and 4th surface EC mirrors respectively. Typically commercial rear-view mirrors are constructed using two glass substrates 10 and 11 as shown in FIG. 1. In a typical 3rd surface mirror, substrate 10 is coated with a transparent conductive coating 13 (e.g., indium tin oxide or ITO) and substrate 11 is coated with a reflective and conductive coating 12. The coating 12 may be a single layer or comprise of multiple layers, e.g., of a metal and a transparent conductor. These substrates are bonded at the perimeter (not shown) and filled with an electrolyte 14 comprising an EC dye redox system. The electrolyte may be a liquid or a solid. This is called a third surface mirror as the reflective coating is deposited on the third surface of the two coated substrates counting from the viewing side. Similarly a fourth surface mirror is shown in FIG. 2, where the substrates 20 and 21 are coated with transparent conductors 23 and 22. Further, substrate 21 is coated with a reflective coating 25 (on the fourth surface of the assembly) which is then coated by other corrosion resistant metal coatings and paint. These are also sealed at the perimeter (not shown) and the space in between is similarly filled with an electrolyte 24.

Figure 3:
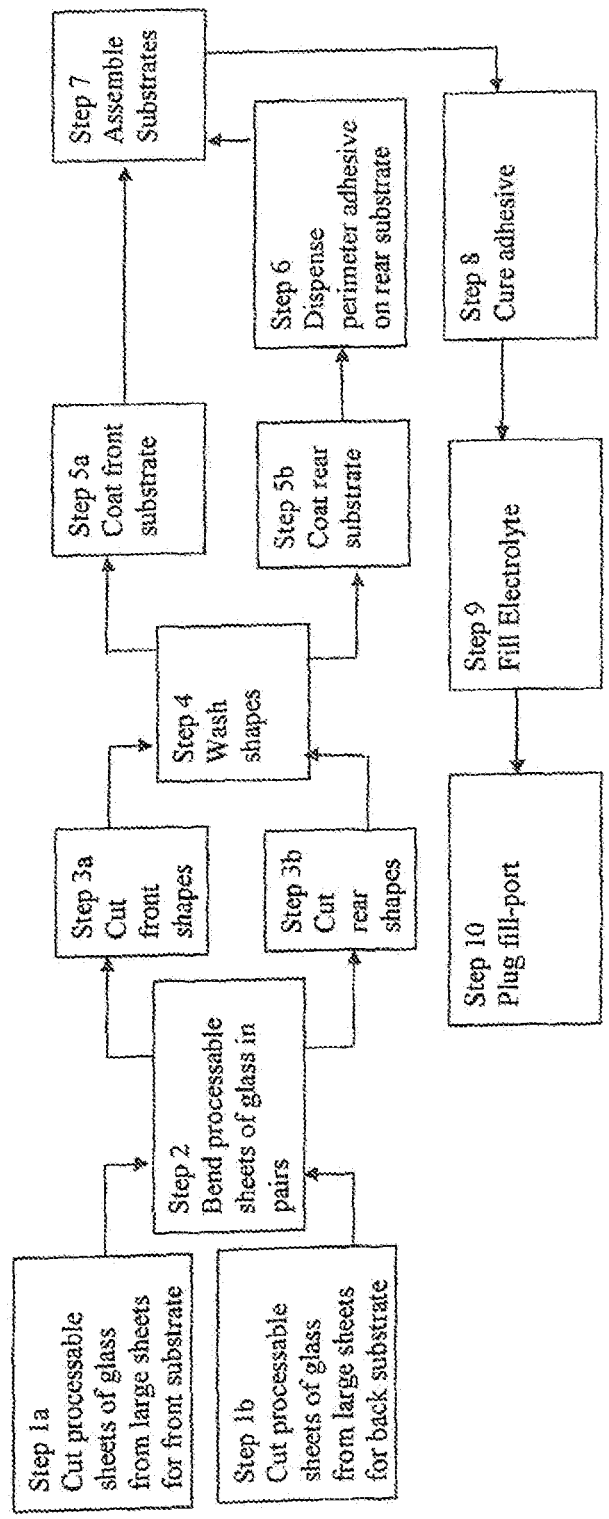
FIG. 3: Typical process schematics used in the art to make EC mirrors.

A typical process of making a $3^{rd}$ surface EC mirror is shown in FIG. 3. This process is for bent or curved devices that are used as passenger side exterior automotive mirrors or driver side aspheric mirrors. For flat devices, the process is largely similar, without the bending step. Also in flat devices, a different process is used where larger pieces of substrates are coated and then cut to a finished shape. Bending process is conducted at high temperature (typically in the range of 400 to 500° C. for glass) where the sheets are stacked in pairs. After bending and cooling, the substrates are cut from the bottom and the top sheet (for front and rear mirror substrates) and are carefully carried through the process as matched pairs and assembled in the same orientation in which these were cut. This ensures that when those substrates are assembled they have a uniform gap so that the electrolyte thickness does not vary. These substrates are then washed and dried in a separate step and then coated. The coating for the front substrate is typically a transparent conductor such as indium tin oxide (ITO) and for the rear it is a conductive reflector that may be a single metallic layer or a combination of a metallic layer followed by a transparent conductor. Typical metals for outside mirrors are ruthenium and rhodium and for interior mirrors these are silver alloys. In step 6, perimeter adhesive is dispensed on one of these while leaving a small gap. The spacer beads in the adhesive and/or on the surface of the substrates control the gap for the electrolyte between the substrates. The cavity is then filled with an electrolyte in a liquid state through the gap in the perimeter adhesive, which is then plugged. If desired, the liquid electrolyte may be further cured or cooled to form a solid electrolyte.

Use of plastic substrates in such applications causes two principal difficulties that need to be overcome as compared to glass, the first being poor barrier properties to oxygen and water and the second being its low scratch resistance. Although there are solutions to both, these solutions can increase the cost of the product. For example PCT application WO 2008/057045 and U.S. Pat. No. 6,866,901 disclose multilayer coatings for improving the barrier resistance. The processes required in both cases can significantly increase the cost. One of the reasons for multiple coats is to fill the pinholes that are present in a single coating which are typically formed by deposition of particles and vapors on the surface. Plastics also present other processing problems, e.g., washing can scratch them and they can absorb water and need to be dried before coating. However automated processes as described in this invention reduce the probability of introduction of such defects and imperfections. It is not necessary that coatings need to be only deposited by physical vapor deposition, and other methods such as chemical vapor, electrochemical and wet chemical including priming methods may be used.

Figure 4:
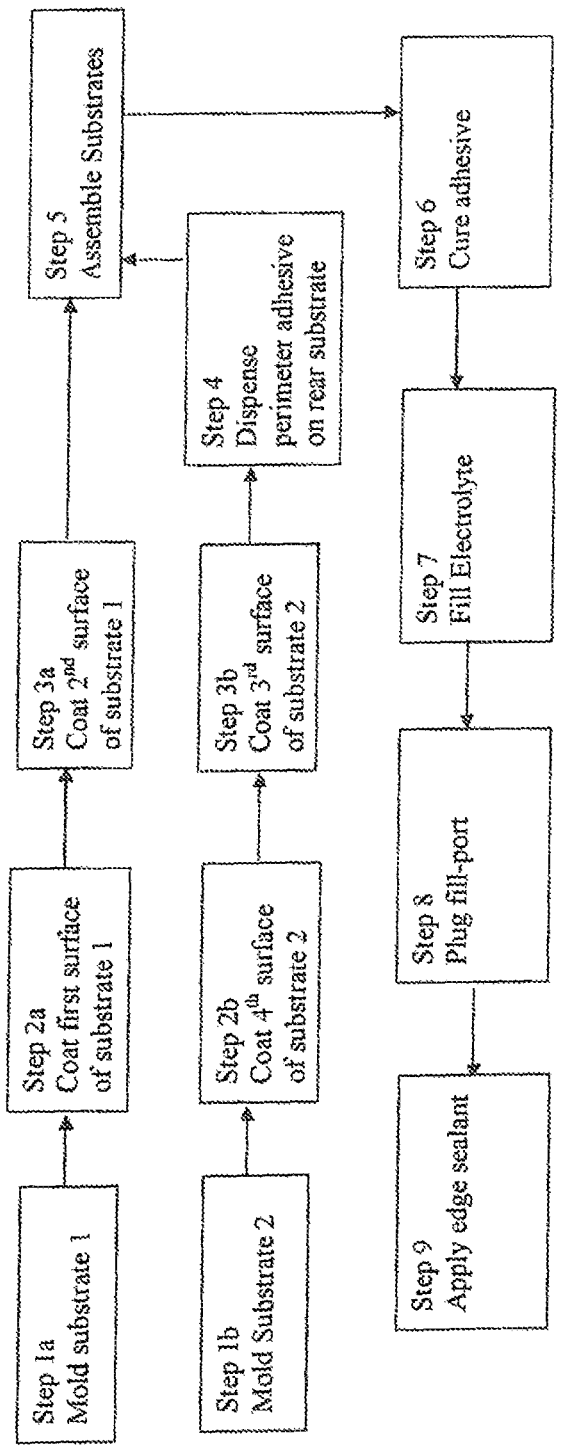
FIG. 4: Modified process schematics according to this invention to make EC mirrors.

A process according to the present invention is shown in FIG. 4. This keeps the advantages from the DVD manufacturing process. More discussions on materials used for substrates and coatings is provided later. This process eliminates the washing or the conditioning step and stream lines the manufacturing operations for producing the product at lower cost. In the mold either both plastic substrates are molded using two different machines or a single machine with tooling for both substrates. Since these are to be coated in the next step, it is preferred that mold release agents are not used. The position of the gates should be such to minimize flow and melt welding marks. The mold opens in a clean atmosphere with controlled humidity and temperature. The atmosphere should be preferably equal to or less than class 10,000 and preferably Class 1000, and the temperature should be in a range of 20 to 40° C. (but preferably within ±2° C.) and humidity in the range of about 20 to 60% (but preferably within in a range of ±5%). As the molded substrates are formed, they are robotically moved (or directly transitioned) to a coater. The direct transitional operational sequences and climate control reduce the possibility of particles or other deposits forming on the substrates which result in imperfections. The transparent conductors, reflectors, the barrier and the hard coats are preferably deposited using PVD process such as sputtering Since the substrates were freshly molded, the outgassing from them will be low and the desired vacuum can be attained quickly (within, a few seconds. e.g., less than 15s). These coaters are typically single target single substrate coaters so that their volume is small and can be evacuated rapidly in less than a few seconds so that the substrates can be coated in-line. There could be a sequence of coaters so that the substrates can be directly transitioned or continuously moved from one to the next, and all of these can be connected through a load lock system. In the direct transitioning process, the substrates do not have to be washed or cleaned between their formation and the coating step. However, in the direct transitioning process, the substrates may be optionally surface treated by a plasma or an equivalent process in order to ensure that coatings deposited in the next step have high degree of adhesion to the substrate. For a simple third surface mirror, one may use the system as described in US patent application 20080074724 (which is included herein by reference), where the front substrate is larger than the rear substrate, and the busbar on the front substrate covers more than 50% of the perimeter. This is particularly advantageous for mirrors with plastic substrates, as it is difficult to get high conductivity transparent conductors (TC) that are durable and have electronic resistivity lower than about 20 ohms/sq. Thus if the front TC has a resistivity in the range of about 20 to 100 ohms/square, one can make automotive mirrors that meet the specifications. Since the front substrate is powered from multiple sides the need for high conductivity is not essential. A preferred resistivity of the TC should be lower than about 70 ohms/square and the transmission of the from substrate along with all of the coatings to be greater than 70% and preferably greater than about 85% (at 550 nm or photopic). If the substrate is colored for exterior mirrors, then this transmission can be lower. In one sequence, after molding, the substrates are conveyed to the coater. The front substrate is processed where a scratch resistance layer of SiN (silicon nitride) is deposited on the first surface, and then it takes the second substrate and puts down a SiN coating on the fourth surface of the second substrate (SiN imparts scratch resistance and also barrier resistance against moisture and oxygen and protection against electrolyte). Aluminum nitride may also be used instead of SiN. The thickness of SiN is typically in the range of 10 to 100 nm and may be different for the two substrates. The substrates are then fed to the next set of waters with multiple chambers each with different sets of targets. The front substrate (second surface) is first coated with SiN followed by a coating of the transparent conductor. The second substrate is then coated (third surface) with an optional tie layer followed by a metallic reflector layer and then an optional transparent conductor. Some of these layers are optional as their use is dependent on the type of metallic layer used and its electrochemical stability. A typical thickness of the transparent conductor coating on top of the metallic reflector is one that gives a retardation of a quarter of wavelength by selecting any wavelength in the range of 450 to 550 nm at an angle of 10 degrees from the normal. This thickness is effective in reducing iridescent colors produced by interference. Since each coating is put down preferably in a separate chamber, one may also mask certain areas as needed. The composite resistivity of the third surface coatings should be less than 10 ohms/square and more preferably less than about 1 ohm/square. The surface reflectivity depends if this mirror is used for exterior or an interior mirror. Typically exterior mirrors have lower reflectivity, thus a reflectivity of about 50% or more (preferably 60% or more) may be suitable for an exterior mirror and a reflectivity of about 70% or more (preferably 80% or more) for an interior mirror. Since the substrates are made out of plastics, one may even use colored plastic material for the substrate to control the bleach reflectivity and color (e.g., blue color for exterior mirrors). Once the coatings are done, the perimeter sealant is dispensed on the conductive side of one of the back substrate, which is then mated with the front substrate with the two conductive sides facing inwards. For mirrors, that are backfilled later with an electrolyte, a small gap in the perimeter sealant is left as a fill hole. The perimeter sealant is cured. One may have to cure these by subjecting the two under pressure by dead weights, vacuum bags or other means of about 0.2 to 1 kg on the entire mirror. One may also optionally dispose a few stops of quick curing soft adhesive (or low modulus adhesive) (cured by radiation or cooling) to keep the plates in position, but allowing the substrates to adjust slightly during the perimeter adhesive curing without acting as stress concentrators. The perimeter sealant may also have spacers to control the gap between the two substrates. Spacers may also be dispersed on the line on the bottom substrate before lowering the top substrate. After curing the perimeter sealant by thermal or optical or any other means, the cavities are subjected to the next step of filling. In this case several cavities may be stacked together and be taken through one or a series of chambers which may also be connected by a load lock. In the first chamber the cavities are evacuated and then filled with argon or an inert gas, in the next chamber argon is evacuated (the steps of evacuation and filling with argon may be done several times in separate or in a single chamber), and then taken to a filling chamber which is evacuated. The fill hole in the cavity (or a stack of cavities) is submerged below the meniscus of the electrolyte and the vacuum in the chamber released. For use with plastic substrates, electrolytes comprising ionic liquids are preferred (see published US Patent application 2004/0233537, which is included herein by reference). After filling, the fill hole is patched with a UV curing adhesive and the busbars attached (unless they were formed before). The cells are then powered and individually tested for kinetics, coloration level, uniformity or other defects. Additional operations such as attachment of busbars, connectors and other components may be done in the same line or these may be done off line. This machine may be used to integrate/bond/attach additional components onto the cells, e.g., displays, electronics, lights, casing and mounting brackets, etc.

Figure 5:
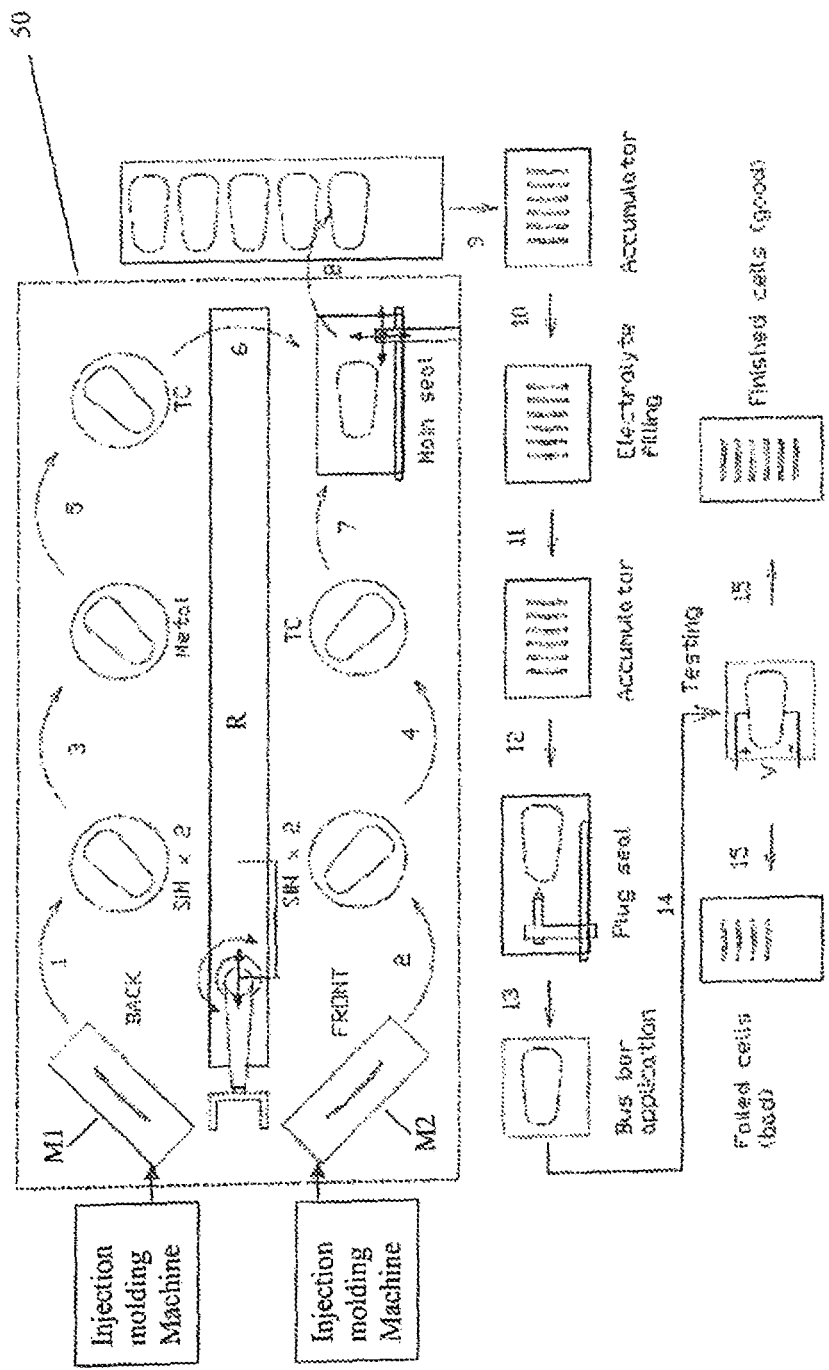
FIG. 5: Equipment layout schematics showing a mirror manufacturing equipment according to the process shown in FIG. 4.

A schematics of an equipment to make a third surface mirror according to the disclosed invention following the guidelines in FIG. 4 is shown in FIG. 5. All the steps are part of an integrated equipment. The steps enclosed within the dotted lines (50), are those which need to be in high clean conditions (clean room class 10,000 or better) until the cell cavity is assembled. It is preferred if at least these steps are enclosed in a chamber. The accumulators at the end of step 15 separate good and the bad cells after they are tested. When the substrate is formed by molding or extrusion, only the molds or the tip of the extrusion die need to be in this chamber, so that the substrates can be processed further before there is a chance of their contamination. Since many operations are involved in completing a device, it may be preferred that for some devices, the extruded products are cut or even thermoformed to a different shape before proceeding further. Figure shows two independent injection molding machines for molding the front and the back substrate. The molds M1 (for back substrate) and M2 (for front substrate) of these injection molding machines are located so that these open within the controlled area 50. The robotic assembly is shown as one unit R. This may comprise of one unit or several units that work independently. In motion 1, the back substrate is robotically picked as soon as it is formed and is transported or directly transitioned to a load lock (not shown) to be coated with SiN on both sides and in motion 3, it is then transported through a load lock to a metalizer and then in motion 5 to the protective transparent conductor coater also through the load lock. Both the metal and the ITO are deposited on one side only. Simultaneously the front surface is molded and then in motion 2 it is transported or directly transitioned for SiN coating on both sides and in motion 4 transported via the load lock for transparent coating on one side. The back substrate through the motion 6 is brought on the station to dispense the main seal and then through motion 7, the front substrate is assembled by placing it on the top of the seal with both conductive surfaces facing inwards. A small hole is left in the perimeter seal to be able to fill the cell with the electrolyte. The assembled cell is put in a conveyor oven through motion 8. Deadweights, pressurized plunger or vacuum bags may be used before putting this in the oven (not shown). Since the ovens have a large thermal load, this unit may be placed outside the controlled atmosphere chamber but connected so that it can receive cells, and if necessary feed the cured cells back into the chamber. One may also use radiation (e.g. UV) curing for the perimeter seal. The cured cells via motion 9 are placed in an accumulator until a batch of cells is ready for filling (alternatively, the cells may be also filled one at a time). The batch is removed for filling via motion 11 and then one cell at a time is removed via motion 12 for plugging the fill port (or plug seal). Through motion 13 this cell travels for bus bar application and then via motion 14 to a testing station. It powers the cell and also tests the cell for any optical, electrical or other defects (all, done automatically) and sorts the cells as good or bad via motion 15. It may even write/mark the bad cells with the problem (not shown) and also write an ID number on all of the cells. A preferred automated machine will conduct all steps after forming of the substrates to the complete assembly of the cell without human intervention. The magnitude of cost savings could be immense, as each of these machines may be capable of forming 5,000 to 20,000 or more cells/day when operated in a single eight hour shift, and several machines may be supervised by a single person.

An important part of this automation is the direct transition process the substrates are coated as soon as these are formed or molded. The direct transition does not preclude steps between their formation and coating as long as these are being transitioned from one to the next, for example a surface activation step as described earlier. Traditionally for devices molding/forming is a separate step from where the molded product or the extruded sheets are accumulated or loaned on a different machine or a facility, which are then transported in batch quantities for coating. This typically requires a washing/cleaning or a drying/conditioning step as the formed products gather particles or other contaminants or even gain moisture depending, on storage conditions, or simply age providing inconsistent surfaces where the differences are based on their storage history. Thus, in the preferred embodiment of this invention, the substrates are formed so that they are first exposed in a conditioned atmosphere (controlled temperature, humidity, particulates, lighting, etc), and as soon as the formed substrates reach a certain condition, e.g., rigidity (e.g. a tensile or flex modulus of 2,000 MPa or more) or temperature (e.g. 20° C. or more less than the melting point or the glass transition temperature), they are automatically passed on to the next processing step, which keeps a very high consistency. This also provides a very high consistency in terms of the substrate history and its properties.

One may configure this manufacturing line with many variations, for example, use of additional coatings, sequencing of operations, forming the front and the rear substrates on separate equipment using different materials, dedicated coating chambers for front and rear substrates, etc. Dispensing methods used for perimeter sealants could be by screen printing or bead dispensing, and inspection stations after each of the steps may also be used The important aspect is that the substrates are coated using an in-line process after their formation. These substrates do not have to be washed/cleaned or conditioned after forming which saves significant amount of space and utilities. Further it is preferred that all of the operations from forming and coating are automated and robotic systems used wherever necessary. A most preferred system is an in line equipment that forms the substrates, coats the substrates and fabricates the cells automatically.

Exterior mirrors may be designed with complex shapes (free form reflector) so as to eliminate the blind spots and with least distortion as seen in spherical mirrors. These complex shapes are more expensive to form from glass, as each shape has to be cut and bent separately. As an example such shapes are described in the literature (R. Andrew Hicks, "Controlling a ray bundle with a free form reflector" Optics Letters, volume 33(15), 2008, p-1672-1674). A typical exterior flat mirror (driver's side) has an angle of view of about 15 to 20° whereas free form mirrors can achieve a view of 45° or more without introducing any distortions (or minimal distortion) but eliminating the blind spot due to its wider view. Curved EC mirrors with a field of view greater than 30° with no distortion are preferred. To make EC mirrors the process is followed as discussed before, where one can mold two shapes with matching curvature and a high precision to provide the desired reflector shape, coat these substrates, and then assemble so that a uniform cell gap between the substrates can be provided. This is then filled with the electrooptic medium and sealed. This process may also be used to make EC mirrors where the mirror is made by depositing all of the coatings on a single substrate (e.g., see U.S. Pat. No. 4,712,879). As an example, these coatings in order are, a transparent conductor, an EC layer, an ion conductor layer, a counterelectrode layer and a conductive reflective layer. One may also use the process to make other types of mirrors with bent shapes. For example, one can combine two distinct curvatures in a single molding (e.g., planar and convex, e.g. see for aspheric concepts, U.S. Pat. Nos. 7,420,756; 6,717,712 and 6,522,451 which are all enclosed by reference herein). Plastics can be molded with high surface finish. Glass molding may also be used, however optional secondary processes liar surface finishing may be required.

Additional coatings/depositions may be used to provide further benefits. For example, titania on first surface for hydrophobicity and self cleaning: patterned coating of a conductive metal on the fourth surface that could be used as a heater; lines or traces of conductors to connect the electrodes electrically to the powering circuit. These conductive lines are deposited to connect the electrodes and or electronics to the back of the devices (see published US patent application US 2008/0074724, which is included herein by reference).

Emissive electrooptic devices such as organic light emitting devices (OLEDs) also have several layers which are sequentially deposited on a substrate. The substrate is formed as discussed earlier and it is further coated on the same integrated equipment. It is preferred that all layers are deposited on this equipment to finish the device, although as an option the partially tilled devices may also be prepared where only some of the coatings are deposited after forming the substrate. In a typical example these are an anode, a hole injection layer, a hole transport layer, an electron blocking layer, an emissive layer, a hole blocking layer, an electron transport layer, an electron injection layer, a protective layer, and a cathode. Some of these layers may have multiple layers, e.g., cathode layer. A device may be fabricated by depositing the layers described, in order (for material and processing details for these layers e.g. see U.S. Pat. No. 7,279,704 and published US patent applications 20090130296 and 20090200927 which are included herein by reference). Some of these layers may be deposited by physical vapor deposition, while others by chemical vapor deposition or by wet chemical methods such as printing (e.g., ink jet printing). There may be additional layers such as harrier and/or scratch resistance layers as discussed for the electrochromic devices above. A significant cost in making solid state lighting is to integrate an OLED device into a luminaire. Using this process OLED device can be integrated with some or all of the luminaire components. Some of these components may also be formed on this machine. For example the OLED device immediately after its formation may be placed automatically in a injection molding machine so that a polymeric component or housing can be made.

Materials

Substrate Materials and Barrier Layers

Typical transparent plastics are polycarbonate, acrylic (polymethylmethacrylate such as Plexiglass grades from Arkema, Philadelphia, Pa.), methacrylate containing copolymers including heat resistant grades (e.g., Delpet 80N from Asahi Kasei, New York, N.Y., Acrylpet VH from Dipolyacrylate Co Ltd from Thailand. Sumipex from Sumitomo Chemical America, New York, N.Y.), poly methyl methacrylate styrene (e.g., TX polymer from Denka Corporation, New York, N.Y.), methyl methacrylate butadiene styrene, polysulfone (e.g., Supradel HTS, from Solvay, Alpharetta, Ga.), cyclic olefins and their copolymers (Zeonor and Zeonex from Zeon Chemicals LP, Louisville, Ky.; APEL from Mitsui Chemicals, Rye-Brook, N.Y.), polystyrene (including hydrogenated polystyrene) and styrene containing copolymers (including acrylonitrile, acrylamides and other acrylics as comonomers), norborene and norbornyl containing polymers (e.g., Arton by JSR America Inc in Cincinnati, Ohio; Zeonar and Zeonex; Topas COC by Topas Advanced Polymers in Florence, Ky.) polyesters and fluorinated polymers. Those transparent polymers that have low water absorption, high optical transmission, low oxygen permeability, low thermal expansion, high hardness and high temperature stability are most preferred. It is difficult to get all of these properties in a single polymer. Some of the preferred polymers are cyclic olefins, acrylics, polycarbonate and their copolymers. These polymers may also comprise of UV additives and colorants to provide a desired hue to the devices. Although only the front substrate has to be transparent, it is preferred that both the substrates be made of the same material to keep the same expansion properties, hence differential stress on the main sealant be low. These materials may also be coated to provide even higher barrier properties, scratch resistance and also hydrophilicity or hydrophobicity on the surface.

Multilayered substrates may also be formed and used for some EO devices. These are used extensively in food and drug industry where inner layers provide high oxygen resistance and the outer layers high water resistance, to increase the overall barrier resistance. Some of these are polymers and copolymers comprise polyacrylonitrile, polyvinyl alcohol, polyvinlydiene chloride, polybutylene, polyesters (e.g. polyethylene terephthalate, polyethylene naphthalate), and nylons (nylon 6, nylon 6.6 and nylon 6,10). Further these polymers may be filled with nano-particles for enhancing UV barrier properties, flame retardance, scratch resistance and also improving barrier to water and oxygen. These nano-particles are typically less than 200 nm (preferably less than 50 nm) in size and their concentration is generally less than 2% by volume to avoid, agglomeration that may result in scattering of light.

Inorganic Harrier Materials and Hard Coats

Typically inorganic barrier coatings for plastics substrates comprise of one or more layers. The barrier material can be transparent or opaque depending on what the substrate is used for. For example, this has to be transparent for the front EC mirror substrate, and for the rear it may be opaque for third surface device. Suitable barrier materials include, but are not limited to, metals, metal oxides, metal nitrides, metal carbides, metal oxynitrides, metal oxyborides, amorphous and crystalline carbon and combinations thereof. Metal oxides, metal nitrides, metal carbides, metal oxynitrides, metal oxyborides may also impart abrasion resistance when they are present as a coating on the exposed surface. Further some of these materials may also be used for a dual purpose in a mirror such as a transparent conductor or a conductor and a reflector, etc. Metals include, but are not limited to, aluminum, titanium, indium, tin, tantalum, zirconium, niobium, hafnium, yttrium, nickel, tungsten, chromium, zinc, alloys thereof, and combinations thereof. Metal oxides include, but are not limited to, silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, and combinations thereof. Metal nitrides include, but are not limited to, aluminum nitride, silicon nitride, boron nitride, germanium nitride, chromium nitride, nickel nitride, and combinations thereof. Metal carbides include, but are not limited to, boron carbide, tungsten carbide, silicon carbide, and combinations thereof. Metal oxynitrides include, but are not limited to, aluminum oxynitride, silicon oxynitride, boron oxynitride, and combinations thereof. Metal oxyborides include, but are not limited to, zirconium oxyboride, titanium oxyboride, and combinations thereof. Suitable barrier materials also include, but are not limited to, opaque metals, opaque ceramics, opaque polymers, and opaque cermets, and combinations thereof. Opaque cermets include, but are not limited to zirconium nitride, titanium nitride, hafnium nitride, tantalum nitride, niobium nitride, tungsten disilicide, titanium diboride, and zirconium diboride, and combinations thereof.

Corrosion Resistant Reflective Materials

Electrochromic mirrors use metal reflectors. These are used as 3rd or 4th surface reflectors as shown in FIGS. 1, and 2. In both cases these have to be protected against corrosion. For third surface where the reflector is also an electrode, requires protection against the electrochemical reactions in the cell, and if parts of it are outside the active cell then these need to be protected against the environment. The protection for the $3^{rd}$ surface mirrors is provided by using a corrosion resistant material and a coating of a transparent conductor. The latter further enhances the corrosion resistance. For example, a corrosion resistant silver alloy may be protected by indium tin oxide coating. For 4th surface, galvanic coatings (e.g. silver overcoated with copper) along with organic paints are used, in third surface mirrors the reflective coating thickness may be tailored for partial transmission for those mirrors, where emissive displays are placed on the back of these mirrors. When the displays are activated they are visible from the front. The protection of reflective coatings is very expensive, particularly for third surface mirrors. These can use many layers of coatings (sometimes ten layers) in precise thicknesses to ensure that the clear layers do not add any iridescent color. These require special edge sealants to stop moisture ingress. Many times these are only limited to the inside of the device so that they are not exposed to the outside or even the perimeter seals do not sit on these, all of which requires expensive masking. These are well described in US patent applications 2009/0116097 and in 2009/0040588. Both of these patent applications are enclosed herein by reference. We prefer reflective materials that do not require additional encapsulation/protection. These may be used as additional layers on other reflectors or by themselves. These reflectors belong to two different categories of materials, first category is metallic compounds that have both reflective and conductive properties and the second category is nanophase metallic alloys.

Examples of metallic compounds are metal nitrides and metal oxynitrides, metal carbides, metal oxycarbides, $MC_yN_zO_s$ (where s may be zero and y and z are simply atomic ratios in relationship to the metal or M) or even mixed metal compounds. These compounds may be stoichiometric or even deficient in the non-metal elements (oxygen, nitrogen and carbon). Some specific materials are zirconium nitride and molybdenum nitride (Schleussner, S. et al, Journal of Physics: conference Series vol 100 (2008) 082016; Westlinder, J., Solid-State Electronics 49 (8), pp. 1410-1413 (2005)). Some of the preferred metals to form these compounds are transition metals, particularly Mo, Zr, V, Cr, Nb, Ti, Ta and W. Further, in several cases the perimeter and the plug adhesive comes in contact with coatings on the third surface, and for that reason their adhesion to the substrate has to be excellent. Thus, adhesion promoting coatings are typically deposited before depositing the reflective layers. The adhesion promoting coatings are typically a thin layer of at least one of the metals, of which the nitride is composed of, or chromium and titanium, or one may use surface plasma treatment. Plasma treatment activates the surfaces of the substrate that results in superior adhesion to the coatings deposited onto such substrates. The use of adhesion promoters is widely practiced and reported in the EC patent literature (e.g., see U.S. Pat. No. 5,668,663 and U.S. Pat. No. 7,300,166). The metal compound coatings are deposited by sputtering, ion beam deposition or also by wet chemical methods. Wet Chemical coatings after deposition require a high temperature treatment which is more suitable for glass than plastic substrates. A preferred method is in US Patent application 20080050528, and this application is incorporated herein by reference. In another method, a polymer solution is used where the metal salts are added to bind to this polymer. Upon heating, a coating is deposited from such solutions in a nitriding atmosphere at elevated temperature, so that nitrides and oxynitrides are obtained. One may deposit such coatings on glass surface and heat them to low temperatures (say less than 250° C.) in air for partial consolidation and then conduct nitridation and bending of the substrates (for bent mirrors) simultaneously at elevated temperatures with proper atmosphere control.

Metal alloys comprising of grain structure that are nano-sized may be used for reflectors as these also provide high corrosion resistance, and in these the grain size is typically less than 40 nm, and preferably less than 10 nm. This is described in U.S. Pat. No. 7,425,255 which is incorporated herein in its entirety by reference. Some of the preferred alloy compositions are W—Ni, Ni—Mo, Co—W, Ni—P, Ni—W—B, Fe—P, Co—Mo, Co—P, Co—Zn, Fe—W, Cu—Ag, Au—Ag, Pt—Ag, Cu—Au—Ag, Cu—Pt—Ag, Pt—Au—Ag, Co—Ni—P etc. Fe—Mo, Co—W, Cr—P. The nanophase alloys in the above patent were formed by electrodeposition. These may comprise of several layers which have slightly different compositions. Process and materials for such coatings are available from Xtalic Corporation (Marlborough, Mass.). Additional silver based alloys are disclosed in US provisional application 61078328 (filed Jul. 3, 2008) which are included herein by reference. Typically, these comprise several metal combinations but usually comprise of at least one or more selected from beryllium, noble elements (i.e. Ru, Rh, Au, Pt and Pd) and rare earth elements (La, Ce, Nd, Sm, Eu). Some of the preferred rare earth elements are samarium and neodymium. With samarium, preferred alloying elements are copper, and optionally titanium and manganese may be added. These nanophase compositions have very high corrosion resistance.

Figure 6:
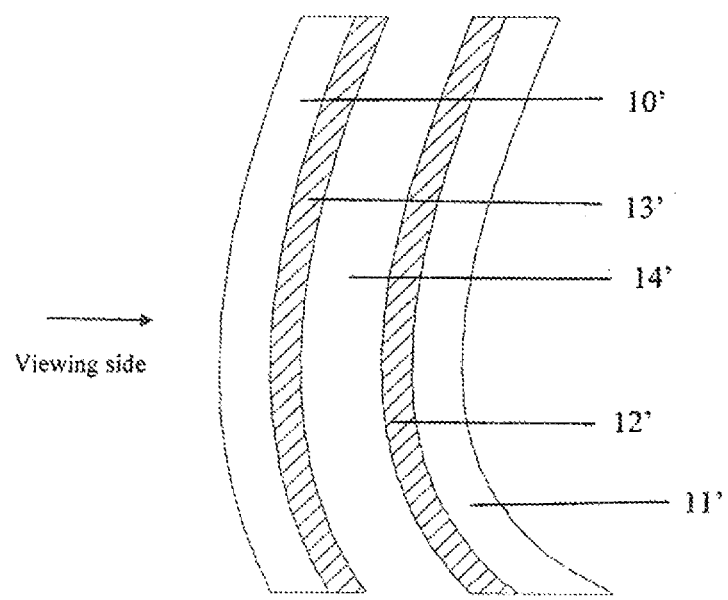
FIG. 6 is similar to FIG. 1, and shows schematics of a curved third surface mirror.

FIG. 6 shows schematics of a curved third surface mirror, e.g. a curved automotive exterior electrochromic mirror, with a free form reflector that would have a field of view larger than 30° FIG. 6 is similar to FIG. 1, but with a prime (') next to each of the noted elements. That aspect of applicants' invention is described, in applicants' specification at original paragraphs 14, 20, and the process for producing the curved, free form reflector is described at original paragraphs 20, and is also shown in original FIG. 5 (note that the molded components M1 and M2 arc curved). It is also described in original claims 10 and 14-16 which are part of the specification.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

The invention claimed is:

1. An integrated process for manufacturing an electrochromic curved automotive mirror, wherein said electrochromic mirror comprises of at least one substrate and a conductive coating, said integrated process comprises the following steps:
   a. molding a substrate, wherein said substrate comprising front and rear surfaces,
   b. and a coating step, wherein at least one of surfaces of the said substrates is coated;
wherein the substrates is molded in a curved shape so as to conform to a shape to provide a free form reflective surface.

2. The integrated process of claim 1, wherein the said mirror is an exterior automotive mirror.

3. The integrated process of claim 1, wherein said integrated process comprises the following steps:
   a. molding a pair of plastic substrates, each comprising front and rear surfaces,
   b. and a coating step, wherein at least one of the surfaces of each of the said pair of substrates is coated to prepare a pair of coated substrates.

4. The integrated process of claim 3, further comprising the steps of
   a. assembling said coated pair of substrates to form a cavity between the pair of substrates
   b. and filling the said cavity with an electrooptic medium to provide the electrochromic curved automotive mirror.

5. The integrated process of claim 4, wherein the process further includes a step of automated inspection of said electrochromic curved automotive mirror to automatically sort between acceptable and the unacceptable devices.

6. The integrated molding process of claim 3 wherein molding the pair of plastic substrates comprises injection molding the pair of plastic substrates.

7. An automotive rearview electrochromic mirror comprising an electrochromic medium and a reflecting surface wherein the said reflecting surface has a free form reflecting shape that has a field of view larger than 30°.

8. An automotive rearview electrochromic mirror as in claim 7, wherein the electrochromic medium is located between two substrates, one, of which has a reflective coating and the other substrate has a transparent conductive coating.

9. An automotive rearview electrochromic mirror comprising an electrochromic medium and a reflecting surface wherein the said reflecting surface comprising a coating formed out of a nanophase metallic alloy.

* * * * *